United States Patent [19]

Singer

[11] Patent Number: 4,503,389

[45] Date of Patent: Mar. 5, 1985

[54] PORTABLE DC DEVICE FOR VERIFYING ABSENCE OF VOLTAGE IN HIGH-TENSION AC CONDUCTORS

[76] Inventor: Edouard Singer, 53 Rue de Mulhouse, 68790 Morschwiller-Le-Bas, France

[21] Appl. No.: 360,392

[22] Filed: Mar. 22, 1982

[30] Foreign Application Priority Data

Mar. 26, 1981 [FR] France ................. 81 06259

[51] Int. Cl.³ ............... G01R 19/155; G01R 19/165; G01R 19/22
[52] U.S. Cl. .................... 324/133; 324/72.5
[58] Field of Search .......... 324/51, 52, 72, 72.5, 324/122, 133, 149; 340/654, 660, 664

[56] References Cited

U.S. PATENT DOCUMENTS

| | | | |
|---|---|---|---|
| 2,884,597 | 4/1959 | Miller | 324/149 |
| 2,942,189 | 6/1960 | Shea et al. | 324/133 |
| 3,009,099 | 11/1961 | Muller | 324/72.5 X |
| 3,029,383 | 4/1962 | Douglas et al. | 324/133 X |
| 3,176,223 | 3/1965 | Goodale | 324/122 |
| 3,309,690 | 3/1967 | Moffitt | 324/133 X |
| 3,660,757 | 5/1972 | Winslow | 324/133 X |
| 3,863,149 | 1/1975 | Johnson | 324/133 X |
| 4,152,639 | 5/1979 | Chaffee | 324/149 X |

FOREIGN PATENT DOCUMENTS 1199016  7/1970  United Kingdom ............ 324/133

OTHER PUBLICATIONS

Bellamy, L. R., "Power Line Voltage Dip Detection", *IBM Technical Disclosure Bulletin,* vol. 17, No. 12, May 1975, p. 3513.

Primary Examiner—Gerard R. Strecker
Attorney, Agent, or Firm—Darby & Darby

[57] ABSTRACT

A device for determining whether electrical equipment carries an alternating current that could endanger maintenance personnel or others in contact with the equipment comprises a conductive probe, a rectifier, a threshold detector and an alarm. The conductive probe makes electrical contact with the equipment, and the rectifier rectifies a fraction of any alternating current carried by the probe as a result of such contact to produce a unipolar signal. The threshold detector responds to the unipolar signal and generates an output signal when the voltage of the unipolar signal exceeds a predetermined threshold. The alarm gives a warning response to said output signal.

13 Claims, 2 Drawing Figures

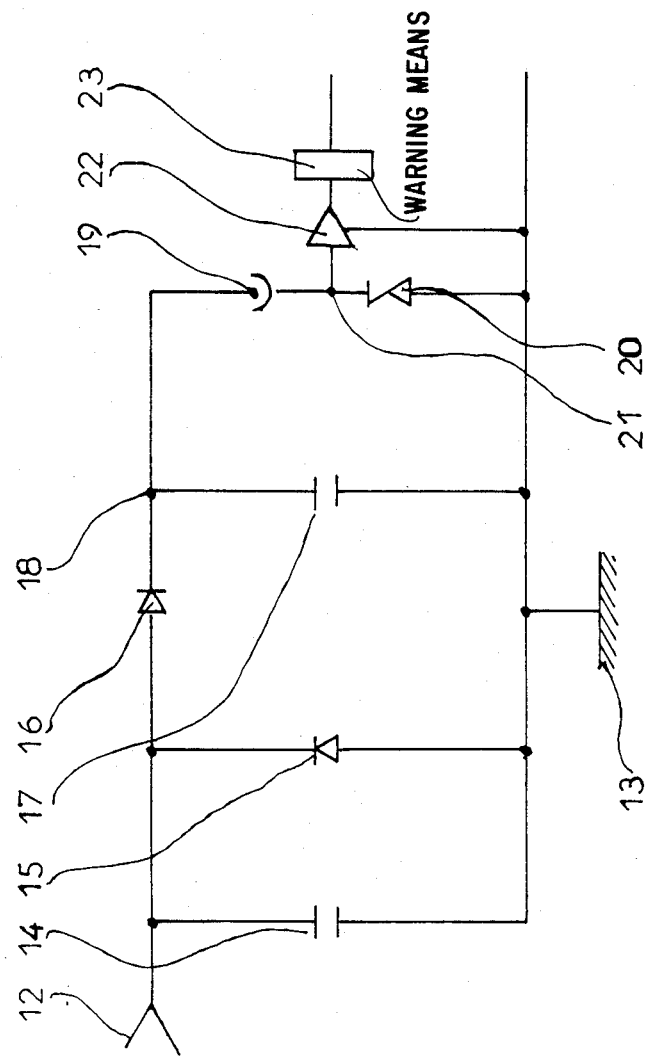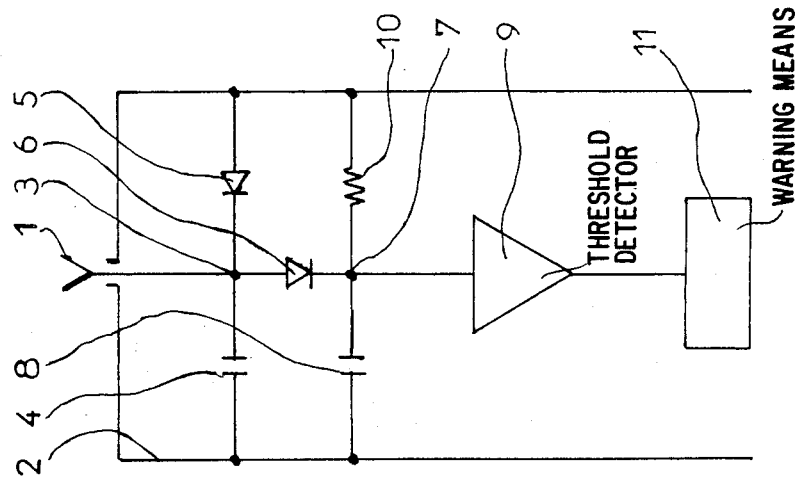

PORTABLE DC DEVICE FOR VERIFYING ABSENCE OF VOLTAGE IN HIGH-TENSION AC CONDUCTORS

BACKGROUND OF THE INVENTION

This invention relates to a portable, single-pole (DC) device for detecting an alternating (AC) voltage. More particularly the invention relates to a device with a variable but predetermined threshold for detecting alternating voltage on lines and in installations carrying, or operating on, high voltage or very high voltage, especially above 1,000 volts, or for verifying the absence of voltage.

In order to avoid serious accidents in the course of operation, construction or maintenance work on high-voltage and very-high-voltage installations, strict safety rules are to be observed.

Work on high-voltage and very-high-voltage installations must be done only after these installations are "dead", i.e., cut off from any source of energy.

They can be considered "dead" only if the effective absence of voltage has been verified.

Then they are short-circuited and grounded.

It is known that the voltage induced in the ground under a 420 kv line can base high as 60 kv. It can be at a still higher level in the case of 750 kv and 1-million-volt lines when carrying current.

A conductor ostensibly cut off from any power supply can be brought to a certain potential by electromagnetic induction or electrical fields in the vicinity of high- and very-high-voltage works. There already are portable testers for the presence or absence of voltage, mounted or insulated poles and including a neon lamp.

These detectors in order to work require the creation of a leak to the ground through the operator, who touches the end of a protective resistor for the neon lamp. These devices are appropriate for low voltage. They are, however, very sensitive to induction, and are most unreliable in the vicinity of operating high-voltage works.

Other conventional devices use a neon lamp or a rare-gas lamp in which the firing of the lamp is detected by a photoelectric cell, for example a photoelectric resistor that controls a sound and/or light generator. Sometimes a spark arrestor is interposed between the line and the electrode of the lamp.

Other conventional devices include resistive voltage dividers that lower the voltage passing through the apparatus to a level compatible with a threshold detector.

And finally, there are conventional devices with a simple spark arrestor, of whose electrodes one is connected to a probe and the other to a metal case forming a Faraday cage.

But in the devices known heretofore for detecting alternating voltage, it is an alternating voltage that is applied to the threshold detecting element.

The operating threshold of these devices is not stable, since the voltage exceeds this threshold only intermittently, in view of the alternations of the grid voltage, which, theoretically, are sine-shaped.

Moreover, the lines and installations carrying high and very-high alternating voltage receive surges and sudden waves that upset the proper operation of these devices, which, furthermore, are sensitive to high-frequency discharges and to the ionization of the air.

The lack of stability of the operating threshold is a source of doubt or errors in the recognition of the cut-off or non-cut-off state of works in the vicinity of operating high- and very-high-voltage installations, which can be the cause of serious electrical accidents.

For the safety of the working personnel, it is indispensable to have reliable devices that can distinguish in a sure and precise fashion an induced voltage from a real voltage on the installations.

SUMMARY OF THE INVENTION

One object of the present invention is to provide a threshold detector that remedies all of these drawbacks, i.e. which is more reliable and more precise in the determination of the threshold beyond which the detector will react to distinguish an induced voltage from a real voltage.

Another object of the present invention is to provide a device of great simplicity and of absolute safety in operation. The device comprises a conductive probe to be brought into contact with the electrical conductors (for example by means of an insulated pole), a protective shield, and a warning means that operates when the voltage exceeds the preset operating threshold.

The invention is characterized in that a rectifier stage transforms a fraction of the alternating current into a substantially unipolar signal, the voltage of which is compared with a variable but predetermined threshold.

BRIEF DESCRIPTION OF THE DRAWING

A better understanding of the invention may be gained from the following detailed description of the preferred embodiments thereof in connection with the appended figures of the drawing, wherein:

FIG. 1 is a schematic representation of a first preferred embodiment of the present invention; and FIG. 2 is a schematic representation of a second preferred embodiment of the invention.

DESCRIPTION OF THE PREFERRED EMBODIMENTS

FIG. 1 shows, schematically, a detector according to the present invention.

It comprises a conductive probe 1, of any appropriate type, to be brought into contact with an electrical conductor (not shown) which is to be tested for the presence of a voltage exceeding a predetermined threshold.

A person skilled in the art can easily determine the most appropriate probe, in view of the nature of the installation, as well as the most appropriate part of the line or installation for verifying the absence of voltage. A protective shield 2 surrounds the elements of the device. This shield is of any appropriate type and, for example, can be covered by an insulating material.

The shield 2 provides protection for the electronic part and constitutes a capacitor plate.

The probe 1 is connected electrically to a point 3 situated in the area protected by the shield 2. Between the point 3 and the local ground, constituted by the shield 2, there is a capacitor 4. This capacitor 4 constitutes one of the elements of a capacitive divider. The other element is constituted by the shield and the earth ground, or any metal element connected to the ground. The capacitor 4 therefore diverts a predetermined part of the alternating current flowing through the apparatus, this part being a function of the capacity of the capacitor, which a person skilled in the art will easily determine.

The voltage between the point 3 and the shield 2 is then rectified, preferably by two diodes 5 and 6. The diode 5 is situated between the point 3 and the shield 2, and is "passing" or conducting preferably from the shield 2 toward the point 3. The diode 6 is situated between the point 3 and a point 7, and is "passing" or conducting from the point 3 toward the point 7, in view of the polarity of the diode 5.

It is also possible to mount the diodes in the opposite directions, if the following stage requires a different polarity.

Between the point 7 and the shield 2, there is connected a filter capacitor 8, or, generally speaking, a component or a plurality of components designed to filter the rectified voltage. Thus, at the point 7, the voltage is rectified and filtered.

It is at the point 7 that the voltage received, which is rectified then filtered, is compared with a variable but predetermined threshold.

In FIG. 1, the threshold detector is represented schematically by an amplifying threshold detector 9 of conventional type. It incorporates means for generating a reference voltage and for comparing the reference voltage to a voltage taken across the terminals of a load 10. The load 10, represented schematically by a resistor in FIG. 1, is connected between the point 7 and the shield 2.

The amplifying threshold detector 9 supplies an output to conventional warning means 11, shown schematically. The warning means 11 is of any appropriate type, for example visual or sonic.

Thus, the current applied to the probe 1 is divided, rectified, then filtered. The voltage comparison with a predetermined threshold is made by an amplifying threshold detector at the terminals of a load.

As a result, it is a rectified and filtered voltage which is compared with a threshold. Moreover, disturbances in the line to which the probe 1 is connected are of no consequence. The device is, in addition, insensitive to the high-frequency discharges that manifest themselves in particular by the production of sparks when the apparatus is brought close to an HT (high voltage) conductor carrying current.

A person skilled in the art can easily determine the value and the characteristics to be given to the various components of the device. In particular, the voltage and current at the point 7 depend on the voltage and current at the probe 1, the capacity of capacitors 4 and 8, and the impedance, or more precisely the resistance, of the load 10.

Numerous modifications of the structure of FIG. 1 can, of course, be made.

In particular, the rectifying means 4 may comprise diodes disposed in a bridge, as is well known to those skilled in the art.

FIG. 2 shows schematically another embodiment of the present invention. Just as in FIG. 1, this device has a probe 12 and a protective shield 13, the latter being represented by a ground. Between the probe 12 and the ground 13, a capacitor 14 diverts a part of the current. The part not diverted is rectified by diodes 15 and 16 and filtered by a capacitor 17. The arrangement of the various components is substantially the same as that of components 4, 5, 6 and 8 in FIG. 1. A point 18 in FIG. 2 then corresponds to the point 7 in FIG. 1.

In the embodiment represented in FIG. 2, the threshold is detected by a rare gas lamp, such as a neon lamp 19. When the voltage at the terminals of this lamp 19 exceeds the priming voltage, which is on the order of 100 volts, the lamp 19 conducts. It therefore works as a threshold switch, the threshold being defined essentially by the priming voltage.

In series with the neon lamp 19 there is a load 20 connecting it to the ground 13. The appearance of a voltage at the terminals of this load 20, i.e., between the point 21 and the ground 13, signifies that the neon lamp is conducting, and hence the voltage exceeds the predetermined threshold.

This voltage at the point 21 actuates warning means of known type, for example sonic or visual, represented at 23. Preferably, the warning means 23 is controlled by a voltage amplifier device 22. This device can be a circuit of the MOS type, an FET transistor, or any other appropriate device known to those skilled in the art.

Preferably, the load 20 is a Zener diode mounted in opposition, in view of the polarization of the point 18. The Zener diode 20 protects the voltage amplifier 22 and the warning means 23. When the voltage at the point 18 exceeds the priming voltage of the neon lamp by a value greater than the breakdown voltage of the Zener diode 20, its resistance becomes very low, and the voltage at the point 21 likewise becomes very low. Circuits 22 and 23 are thus protected from a surge. The Zener diode 20 will therefore be chosen with a breakdown voltage equal at the most to the voltage at which the circuits 22 and 23 are in danger of damage.

In case of a breakdown of the Zener diode, the overstepping of the threshold is still detected, inasmuch as the circuit 22 is a voltage amplifier and the voltage at the point 21, although very low, is not zero.

Those skilled in the art can easily determine the most appropriate nature and characteristics for the various components, in particular for adapting the device to the assumed value of the voltage, the measuring standards, and the safety standards in force.

In the case of aerial lines, the device according to the present invention can be mounted at one end of an insulated pole, and the warning means, or at least a part of it, can be mounted at the other end of this pole, or at least in proximity to it. The device can also be enclosed in an insulated case, to meet applicable safety standards.

Furthermore, the device preferably includes means for automatic control of proper operation, which those skilled in the art will easily be able to determine.

The description of the preferred embodiment of the invention, and in particular that of the device in FIG. 2, is given by way of example only, and other embodiments of the present invention can be employed without thereby departing from the scope thereof. Accordingly, the scope of the invention is defined by the appended claims.

What is claimed is:

1. A device for determining whether electrical equipment carries an alternating current that could endanger maintenance personnel or others in contact with the equipment, comprising:
   a protective conductive shield in the form of a container serving as a local ground for said device;
   a conductive probe mounted within said shield and extending beyond said shield for making electrical contact with said equipment;
   first diode means positioned within said shield and connected directly to said probe and second diode means connected between said shield and said probe for rectifying at least some of any alternating current carried by said probe as a result of said contact to produce a unipolar signal;

a capacitive divider means operatively associated with said shield for directing only a portion of the current carried by said probe to said rectifying means, said divider means including (1) a capacitor means connected from the probe to said shield and (2) said shield in combination with earth ground;

threshold detecting means within said shield and connected directly to the first diode means for generating an output signal when the voltage of said unipolar signal exceeds a predetermined threshold; and alarm means connected to said threshold detecting means for generating an alarm in response to said output signal.

2. A device according to claim 1 characterized in that it is portable.

3. A device according to claim 1 wherein said threshold detecting means is adjustable in such a manner as to adjust said predetermined threshold.

4. A device according to claim 1 wherein said alarm means comprises amplifying means whereby said alarm means generates said alarm in response to low values of said output signal.

5. A device according to claim 1 further comprising filter means electrically connected to said first and second diode means and threshold detecting means for filtering said unipolar signal, said threshold detecting means being responsive to said unipolar signal as filtered.

6. A device according to claim 5 further comprising a load electrically connected to said threshold detector, said filtered unipolar signal being applied both to said load and to said threshold detector.

7. A device according to claim 6 wherein said load is in parallel with said threshold detector.

8. A device according to claim 6 wherein said load is in series with said threshold detector.

9. A device according to claim 6 wherein said threshold detector comprises a neon lamp in series with said load, said alarm means being connected to said neon lamp and said load in such a manner that the same voltage is applied to said alarm means and said load.

10. A device according to claim 6 wherein said load comprises a resistor.

11. A device according to claim 6 wherein said load comprises a reverse-biased Zener diode.

12. A device according to claim 11 wherein said Zener diode has a breakdown voltage selected to limit the extent to which the voltage applied to said alarm means can exceed said threshold voltage, thereby protecting said alarm means from damage by excessive voltage.

13. A device according to claim 1 wherein said first and second diodes are connected to said probe in such a manner that they are respectively conducting during alternate half-cycles of any alternating current applied to said probe.

* * * * *